US008874858B2

(12) United States Patent
Engin

(10) Patent No.: US 8,874,858 B2
(45) Date of Patent: Oct. 28, 2014

(54) RECONFIGURABLE INTERLEAVER HAVING RECONFIGURABLE COUNTERS

(75) Inventor: Nur Engin, Eindhoven (NL)

(73) Assignee: NXP, B.V., Eindhoven (NL)

( * ) Notice: Subject to any disclaimer, the term of this patent is extended or adjusted under 35 U.S.C. 154(b) by 602 days.

(21) Appl. No.: 13/157,085

(22) Filed: Jun. 9, 2011

(65) Prior Publication Data

US 2011/0307673 A1 Dec. 15, 2011

(30) Foreign Application Priority Data

Jun. 10, 2010 (EP) ..................................... 10165467

(51) Int. Cl.
*H03M 13/27* (2006.01)
*G06F 12/00* (2006.01)
*H03M 13/00* (2006.01)

(52) U.S. Cl.
CPC ...... *H03M 13/2789* (2013.01); *H03M 13/2764* (2013.01); *H03M 13/6525* (2013.01); *H03M 13/2739* (2013.01); *H03M 13/2775* (2013.01); *H03M 13/6519* (2013.01); *H03M 13/2725* (2013.01); *H03M 13/271* (2013.01); *H03M 13/2771* (2013.01); *H03M 13/276* (2013.01)
USPC ............................. 711/157; 711/200; 711/217

(58) Field of Classification Search
USPC ........................... 711/157, 200, 217, E12.001
See application file for complete search history.

(56) References Cited

U.S. PATENT DOCUMENTS

| | | | |
|---|---|---|---|
| 2002/0103839 A1* | 8/2002 | Ozawa ........................... | 708/490 |
| 2004/0187063 A1 | 9/2004 | Fanfelle et al. | |
| 2004/0193762 A1* | 9/2004 | Leon et al. ...................... | 710/52 |
| 2007/0101231 A1* | 5/2007 | Kutz et al. ...................... | 714/755 |

FOREIGN PATENT DOCUMENTS

WO 96/37050 A1 11/1996

OTHER PUBLICATIONS

Brian Randell. Hardware/software tradeoffs: a general design principle?. SIGARCH Comput. Archit. News 13, 2 (Jun. 1985), pp. 19-21.*
"On the Algebraic Channel Interleaver Designer", Nortel Networks 3GPP, vol. RAN WG1, 22 pgs., retrieved from the Internet at: http://www.3gpp.org/ftp/tsg_ran/wg1_rl1/TSGR1_04/Docs/Pdfs/R1-99466.pdf (1999).
"$3^{rd}$ Generation Partnership Project; Technical Specification Group Radio Access Network; Multiplexing and Channel Coding (FDD)", 3G TS 25.212 V3.30, 3GPP Organisational Partners' Publications Offices, 62 pgs (1999).
Barbulescu, S. et al. "Turbo Codes: A Tutorial on a New Class of Powerful Error Correcting Coding Schemes, Part 1: Code Structures and Interleaver Design", J. of Electrical and Electronics, 27 pgs. (revised version—Oct. 26, 1998).

(Continued)

*Primary Examiner* — Michael Alsip
*Assistant Examiner* — Ralph A Verderamo, III

(57) ABSTRACT

A reconfigurable interleaver is provided, configured to produce a sequence of interleaved addresses, configurable for at least two different interleaving patterns. The reconfigurable interleaver comprises a plurality of reconfigurable counters. The number of values that the counters count is configurable as are their start values. The interleaver further comprises a plurality of memory in which the counters indicate memory positions so that values may be retrieved. Computational elements compute an interleaved sequence of addresses in dependency on the retrieved values. By reconfiguring the counters and possibly changing the content of the memories, the interleaver may be configured for a different interleaving pattern.

16 Claims, 6 Drawing Sheets

(56) References Cited

OTHER PUBLICATIONS

Barbulescu, S. et al. "Turbo Codes: A Tutorial on a New Class of Powerful Error Correcting Coding Schemes, Part II: Decoder Design and Performance", J. of Electrical and Electronics, 21 pgs. (revised version—Oct. 1998).

Neeb, C. et al. "Network-on-Chip-Centric Approach to Interleaving in High Throughput Channel Decoders", IEEE Int'l. Symp., Circuits and Systems, vol. 2, pp. 1766-1769 (2005).

"Digital Video Broadcasting (DVB); Framing Structure, Channel Coding and Modulation for Satellite Services to Handheld Devices (DVB-SH) Below 3 GHz", DVB Document A 111, , 68 pgs, retrieved from Internet at: http://www.dvb.org/technology/standards/a111_r2_DVB-SH_dEN_302583v010201.pdf (Dec. 2009).

Extended European Search Report for Patent Appln. No. 10165467.1 (Nov. 23, 2010)xxx.

"3rd Generation Partnership Project; Technical Specification Group Radio Access Network; Multiplexing and Channel Coding (FDD)", 3GPP TS 25.212 V7.5.0, Release 7; May 2007.

\* cited by examiner

US 8,874,858 B2

RECONFIGURABLE INTERLEAVER HAVING RECONFIGURABLE COUNTERS

This application claims the priority under 35 U.S.C. §119 of European patent application no. 10165467.1, filed on Jun. 10, 2011, the contents of which are incorporated by reference herein.

FIELD OF THE INVENTION

The invention relates to a reconfigurable interleaver configured to produce a sequence of interleaved addresses, configurable for at least two different interleaving patterns.

The invention also relates to a method of reconfiguring an interleaver. The invention also relates to a corresponding computer program product and a corresponding system.

BACKGROUND OF THE INVENTION

Turbo coding is included in the physical layer of many broadcasting and wireless communication standards. A Turbo decoder included in the physical layer includes an interleaver, as specified by the standard.

Turbo codes are related to channel coding schemes, which are used, e.g., in wireless communication and networking standards, such as: the Universal Mobile Telecommunications System (UMTS), Code division multiple access 2000 (CDMA2000), Worldwide Interoperability for Microwave Access (WiMax), Wireless Broadband (WiBro) the High-Speed Downlink Packet Access (HSDPA) protocol, etc.

For example, a sender encodes original data using a turbo encoder for transmission, a receiver decodes received data using a turbo decoder. During transmission errors may occur. The use of a turbo encoder and turbo decoder allows the correction of errors.

The throughput requirements of wireless standards have been increasing. New standards, such as UMTS LTE, require over 100 Mbps peak throughput.

A turbo decoder comprises two main parts, a Soft-Input-Soft-Output (SISO) decoder, and an interleaver. During execution, the decoder works on so-called soft data. Soft data gives probabilistic information on the data that was originally sent. The decoder and interleaver cooperate in an iterative process to correct the errors in a received data frame. For example, first the decoder corrects a few errors in the data. Next, the frame is interleaved and decoded again. In this way, in each iteration more errors are corrected.

The structure and operation of turbo decoders is, for example, described in S. A. Barbulescu and S. S. Pietrobon, "Turbo codes: A tutorial on a new class of powerful error correcting coding schemes, Part 1: Code structures and interleaver design", *J. Elec. and Electron. Eng., Australia*, vol. 19, pp. 129-142, September 1999; and S. A. Barbulescu and S. S. Pietrobon, "Turbo codes: A tutorial on a new class of powerful error correcting coding schemes, Part 2: Decoder design and performance," *J. Elec. and Electron. Eng., Australia*, vol. 19, pp. 143-152, September 1999.

A turbo decoder consists of two main parts, a Soft-Input-Soft-Output (SISO) decoder, and an interleaver. The SISO decodes the data frame, corrects a few errors. The frame is interleaved and decoded again. In this way, each time more errors are corrected. These iterations are repeated for a predefined number of times, until no more errors are corrected, or until some other pre-defined stopping criterion is satisfied.

This iterative decoding only works if the data is interleaved. The interleaving rules are specified in the communication standard and are designed to shuffle data in a pseudo-random manner.

When only one standard needs to be supported, the interleaver address generation can also be implemented in dedicated hardware. However, different standards specify turbo interleaving schemes that vary largely.

SUMMARY OF THE INVENTION

One way to support multiple interleaving patterns is to store the interleaving patterns in a memory as a look-up table. This approach has as a disadvantage that a large amount of memory is needed. Especially standards which support many different block length are hard to support in this manner.

Another way to support multiple interleaving patterns is create dedicated hardware for each one. Although dedicated hardware need less memory, it requires a large footprint to support many different interleaving standards. Supporting new standards is not possible with existing hardware.

It would be of advantage to have an interleaver that may be reconfigured to support a large number of interleaving schemes. In particular, it would be of advantage to have an interleaver that may be reconfigured for use with multiple turbo code standards.

The invention provides a reconfigurable interleaver comprising a plurality of counters, each counter of the plurality of counters being configurable with a total count number defining a number of values to count and with a start value defining a value from which to start counting, a plurality of memories, each memory of the plurality of memories being configured to retrieve values from memory positions in the memory indicated by a counter of the plurality of counters associated with the memory, and a plurality of computational elements configured to operate on the values retrieved from the plurality of memories. The reconfigurable interleaver is configured to produce a sequence of interleaved addresses. A next one of the interleaved addresses in the sequence of interleaved addresses is obtainable by advancing at least one counter of the plurality of counters and by operating of the computational elements on at least a value retrieved from a memory associated with the advanced counter. By reconfiguring at least one of the counters with at least one of the total count number and the start value, the reconfigurable interleaver is configured for one of at least two different interleaving patterns.

By reconfiguring a counter so that a memory associated with that counter retrieves different values from different positions in the memory, the behavior of the interleaver may be modified, and thus also the sequence of interleaved addresses that it produces. This allows for a high degree of re-use in the computational element thus providing a reconfigurable interleaver with a relatively small footprint compared to its configurability.

During use, the plurality of counters of the reconfigurable interleaver are configured to count a particular number of values, the total count number, and to start counting from a particular start value. The memory may contain different values at different memory positions, hence if the start value is changed the values retrieved from the memory are also changed. Similarly, if the total count number is changed the memory will retrieve from more or fewer memory positions.

The reconfigurable interleaver produces a sequence of interleaved addresses. Typically, the sequence is produced in a series of cycles, wherein in each cycle one of the addresses in the sequence is obtained. A cycle may begin by advancing one or more, or all, of the counters. As a result, a memory associated with the advanced counter will retrieve a value. Typically, the value is retrieved from a new memory position, and may thus be different from the value previously retrieved from that memory.

A different approach to a flexible interleaver is to use a look-up-table memory of sufficiently large size. It is then possible to pre-calculate all the interleave addresses needed for a particular interleaving scheme on a processor (e.g. using a host processor of the application on which the interleaver is used) and load these values into the look-up-table memory before turbo decoding starts. The disadvantage of this solution is that this needs to be done every time the block size changes. The processor needs to be claimed for the computation of the interleave addresses for the complete block. Especially for large turbo block sizes, the computation of the interleave addresses can take significant compute time for the host processor. Furthermore, the complete block addresses need to be loaded which means also the start of the turbo decoding needs to be stalled until this is done, decreasing the throughput of decoding if the block size changes regularly.

The reconfigurable interleaver may be used to produce an interleaved sequence. The interleaver may be used in any field wherein an interleaver for interleaving a sequence of data or addresses etc is desirable. The interleaver is especially useful, when one or more of a high performance, a low IC footprint, and high degree of reconfigurability is desired.

The plurality of counters may be implemented in hardware. A counter may comprise a register storing a current value of the counter and advancing means for advancing the counter. The advancing means may comprise an input for receiving a signal that the counter is to be advanced. For example, the advancing means may receive a clock signal, for advancing the counter at each clock tick. The advancing means may further comprise storage means for storing the total count number and the start value. The advancing means being configured for advancing the counter until total count number values have been counted. A counter may also be implemented by storing the counter value in a memory. The counter value being advanced by software means running on a processor. The plurality of counters are preferably independently reconfigurable.

The plurality of memories may be a plurality of physically distinct memories. However the memories may also correspond to different regions of one larger physical memory. For example, a memory manager may map memory regions in the larger memory to the plurality of memories. Another way to partition a single memory into multiple memories is to partition the memory in to multiple address blocks and to configure each counter with a start value such that it each produces address within a different address block.

The retrieving of values from memory positions in the memory indicated by a counter may be performed by hardware means. For example, a retrieving means may be associated with a memory to retrieve a value from a memory position indicated by an associated counter. However, the retrieving means may also be implemented by software means, configured to retrieve a value from a counter stored in a position accessible by the software means, e.g., in a memory or a register.

In an embodiment, each memory is associated with a different counter. In an embodiment, a single counter is associated with more than one memory. In an embodiment, exactly one counter is associated with each memory. In an embodiment, multiple counters are associated with a single memory for retrieving of multiple values from the same memory.

A computational element may be implemented in hardware. The computational elements may be organized as a computational network. The computational elements in the network receive values from the memories either directly, or indirectly after another computational element performed an operation upon it.

Implementation in hardware may be done using IC technology.

In an embodiment, at least one counter of the plurality of counters is configured for, after having counted total count number values, to repeat the counting starting from the start value. The values that are needed for computation of interleaved sequences typically contain repetitions. To save on memory space, a counter may be programmed to repeat the values that indicate the repeated values.

In an embodiment, all of the counters are configured for, after having counted total count number values, to repeat the counting starting from the start value. An interleaver may be configured to repeat computing the same interleaved sequence. In this way the hardware can be started once more without reconfiguring, so that the decoder can do another iteration using the interleaver.

In an embodiment, a computational element is configured to receive two values retrieved from two different memories, and is configured to produce a value by operating upon the two retrieved values. The computation may be performed by a number of relatively simple elements, which are configured for small operations. By combining such elements in a computational network, more advanced computation may be performed by their combination.

For example, the computational element configured to receive two values, is configured to produce the value by adding or multiplying the two retrieved values. Other operations are also possible, e.g., xor operation, etc.

In an embodiment, the computational element configured to receive two values, is configured to produce the value by adding the two retrieved values, and the reconfigurable interleaver being configured that in one of the at least two different interleaving patterns, a counter associated with a memory comprising at least one zero are configured for the memory to retrieve only the zero value.

In an embodiment, the computational element configured to receive two values, is configured to produce the value by multiplying the two retrieved values, and the reconfigurable interleaver being configured that in one of the at least two different interleaving patterns, a counter associated with a memory comprising at least one one ('1') value are configured for the memory to retrieve only the one value.

When reconfiguring the interleaver according to the invention, it may be that some part of its reconfiguration flexibility is not needed to perform the current interleaving pattern. Instead of turning-off a counter and/or its associated memory, the counter may be configured in such a way that the values retrieved from the memory do not have an influence on the remainder of the computations for the interleaved sequence.

For example, if two memories are connected to an addition element, the effect of one of the memories may be bypassed, by configuring that memory to always produce a zero ('0'). The addition of zero has no effect on the other value.

For example, if two memories are connected to a multiplication element, the effect of one of the memories may be bypassed, by configuring that memory to always produce a one ('1'). The multiplication with one has no effect on the other value.

In an embodiment, the total count number is set to one and the start value is set to indicate the position in the memory containing the 0 or 1 as appropriate, and the counter is configured to repeat itself after having counted total count number values.

In an embodiment, the reconfigurable interleaver comprises at least one selection element (also referred to as 'MUX'). The selection element is configured to receive a selection bit, to receive two values and to output one of the two values in dependency upon the selection bit. At least one of the plurality of the computational elements being configured to receive as input the output of the selection element, or the selection element being configured to receive one of its two input values from the computational element. The configuring of the reconfigurable interleaver for one of the at least two different interleaving patterns is further in dependency upon the selection bit.

To further increase the configurability of the interleaver, the routing of data through the computational elements may be modified by selection element. For example, if some computational element should receive as input the sum of two values for one interleaving pattern but their product for another, then the computational element may be connected to both an addition element and a multiplication element, through a selection element. If the interleaver is configured for one interleaving pattern, the selection element is configured to forward the addition result, yet when the interleaver is configured for the other interleaving pattern, the selection element is configured to forward the multiplication result.

In an embodiment, the reconfigurable interleaver comprises a buffer element, for receiving a value and to output the value for operating upon by the computational elements to obtain a next one of the interleaved addresses in the sequence of interleaved addresses.

For some interleaving patterns a next value in the sequence depends on a previous value. A buffer element, temporarily stores a computation result for use in the computation of a next address in the sequence. The buffer element, may be configured to store a value for one iteration, i.e., store a value for use in computing the next address. A buffer element may also store multiple values. For example, a buffer element may comprise a first in first out buffer (FIFO), also known as a queue.

In an embodiment, the reconfigurable interleaver comprises a configurable limit element. The limit element is configured to receive a limit bit and a limit value and to receive a limit input value. The limit element is configured to perform and output a modulo operation upon the limit input value using the limit value as modulus for one value of the limit bit. The limit element is configured to perform a limiting operation upon the limit input value using the limit value as limit, outputting the limit input value if the limit input value is smaller than the limit value, for one other value of the limit bit. The configuring of the reconfigurable interleaver for one of the at least two different interleaving patterns is further in dependency upon the limit bit or the limit value.

Some interleaving patterns require a modulo or a limit operation. These two operations are to some extent similar allowing efficient implementation with a low footprint. For example, to perform a limit operation, the input value may be compared to the limit value, if the limit input value is higher than the limit value the limit element can take some action, e.g., not output a value, output a 0, set a signal indicating a invalid address etc. An additional possibility is to limit the number of bits of the output, that is, if an output value would be generated which is higher than the limit value, some number of its bits are discarded. To perform a modulo operation, the input value may also be compared with a limit value, e.g., subtracting the modulus from the limit input value. The means for comparing the limit input value with the limit value may be shared, between the modulo operation and/or the limiting operation and/or the discarding operation.

In an embodiment, a limit element is used which may be configured with a limit value, and an operation value. The operation value configures the limit element for one of at least three modes of operation. In one mode of operation, the limit element performs a modulo operation, using the limit value as modulus. In one mode of operation, the limit element perform a limiting operation, setting a valid bit if the input is larger than the limit value, and resetting the valid bit if the input is smaller than or equal to the limit value. In one mode operation, the limit element performs a discarding operation, outputting the input value with some number of bits discarded if the input is larger than the limit value, and outputting the input if the input is smaller than or equal to the limit value.

For example, the discarding operation may be performed by outputting a predetermined number of the least significant bits, or discarding a predetermined number of the most significant bits. The number of bits to output may be configurable.

In an embodiment, the limit element is configured to receive a limit bit and a limit value and to receive a limit input value. The limit element is configured to perform and output a modulo operation upon the limit input value using the limit value as modulus for one value of the limit bit. The limit element is configured to perform a discarding operation upon the limit input value using the limit value as limit, outputting the limit input value if the limit input value is smaller than the limit value and outputting a predetermined number of the least significant bits of the limit input value, for one other value of the limit bit.

The interleaver may comprise a processor or be arranged for use in combination with a processor. The processor may, e.g., pre-compute the values of the memory, or advance the counters. The processor may obtain the interleaved addresses for use in a turbo decoding algorithm. The turbo decoder may be implemented in hardware, software or a combination thereof.

An interleaver according to the invention may be used in an electronic device, in particular a mobile electronic device. The interleaver may be used in a computer. The interleaver may be implemented entirely in dedicated hardware. The interleaver may be implemented in software, or using a combination of dedicated hardware and general purpose hardware.

The invention also relates to a turbo encoder or decoder comprising an reconfigurable interleaver as in any one of the preceding claims. The turbo decoder may for example be used in mobile phones, satellite receivers, a set-top cable TV receiver, or the like. The interleaver may be used in combination with wireless and wire receiving. The interleaver may also be used in a turbo encoder for a transmitting system, e.g., a transmitting system corresponding to the receiving examples given above.

The invention further relates to a method of reconfiguring an interleaver. The method comprises configuring a plurality of counters with a total count number defining a number of values to count and with a start value defining a value from which to start counting, retrieving values from a plurality of memories, a value being retrieved from a memory position in a memory indicated by a counter of the plurality of counters associated with the memory, operating on the values retrieved from the plurality of memories, producing a sequence of interleaved addresses, a next one of the interleaved addresses in the sequence of interleaved addresses being obtainable by advancing at least one counter of the plurality of counters and by operating of the computational elements on at least a value retrieved from a memory associated with the advanced counter. By reconfiguring at least one of the counters with at least one of the total count number and the start value, the reconfigurable interleaver is configured for one of at least two different interleaving patterns.

A method according to the invention may be implemented on a computer as a computer implemented method, or in dedicated hardware, or in a combination of both. Executable code for a method according to the invention may be stored on a computer program product. Examples of computer program products include memory devices, optical storage devices, integrated circuits, servers, etc. The invention may also be used in online software.

In a preferred embodiment, the computer program comprises computer program code means adapted to perform all the steps of a method according to the invention when the computer program is run on a computer. Preferably, the computer program is embodied on a computer readable medium.

A reconfigurable interleaver is provided, configured to produce a sequence of interleaved addresses, configurable for at least two different interleaving patterns. The reconfigurable interleaver comprises a plurality of reconfigurable counters. The number of values that the counters count is configurable as are their start values. The interleaver further comprises memory in which the counters indicate memory positions so that values may be retrieved. Computational elements compute an interleaved sequence of addresses in dependency on the retrieved values. By reconfiguring the counters the interleaver may be configured for a different interleaving pattern.

BRIEF DESCRIPTION OF THE DRAWINGS

The invention is explained in further detail by way of example and with reference to the accompanying drawings, wherein.

Throughout the Figures, similar or corresponding features are indicated by same reference numerals.

LIST OF REFERENCE NUMERALS IN FIGS. 1 to 6

Figure 1:
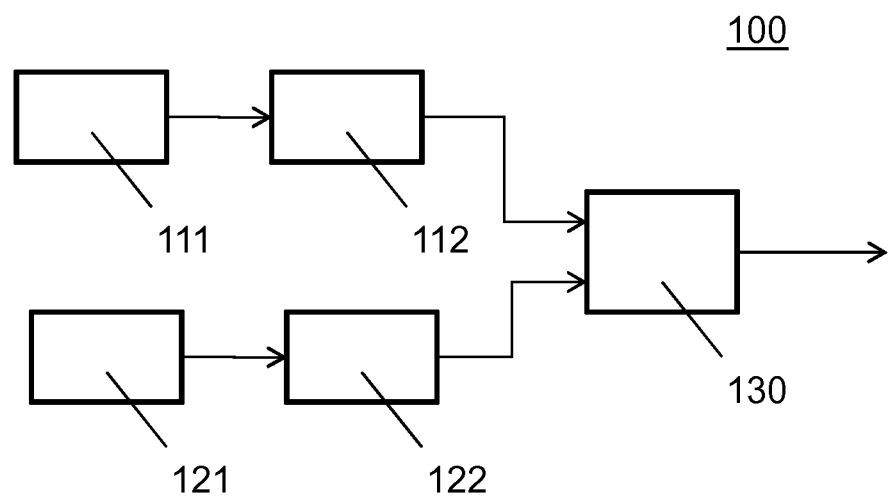
FIG. 1 is a block diagram illustrating a first embodiment of the reconfigurable interleaver according to the invention.

100 a reconfigurable interleaver
111, 121 a reconfigurable counter
112, 122 a memory
130 a computational element
220 a register
210 total count number
230 start value
240 advance means
331, 332 a computational element
340 a selection element
410 a buffer
500 reconfigurable interleaver
502, 504 memory
506 multiplier
508 bit selector
510,512 memory
514 selection element
516 multiplier
518 adder
520 selection element
522 limit element
524 buffer
526 adder
528 a memory
530 selection element
532 adder
534 adder
536 limit element
538 buffer
600 a decoding system
602 an interleaver
604 a controller
606 a decoder
608 a memory
610 a reconfiguration means
612 a connection for writing to a memory
614 a connection for reading from a memory

DETAILED EMBODIMENTS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. Rather, the scope of the herein disclosed subject matter is determined by the claims.

Turbo coding is a channel coding scheme that is used in wireless broadcasting, communication and networking standards such as DVB-SH, ETSI-SDR, UMTS, CDMA2000, UMTS, and UMTS LTE. Details of these standards, including the interleaving schemes used therein can be found in the following references (the standard documents):

3rd Generation Partnership Project. Technical specification group radio access network; multiplexing and channel coding (FDD). Technical Report 3G TS 25.212 v3.3.0 Draft-1, Technical Specification, June 2000.

Framing Structure, channel coding and modulation for Satellite Services to Handheld devices (SH) below 3 GHz DVB Document A111 Rev. 1 Jul. 2007, and 3GPP TS 25.212 V7.5.0 (2007-05) Technical Specification 3rd Generation Partnership Project; Technical Specification Group Radio Access Network; Multiplexing and channel coding (FDD) (Release 7).

Figure 7:
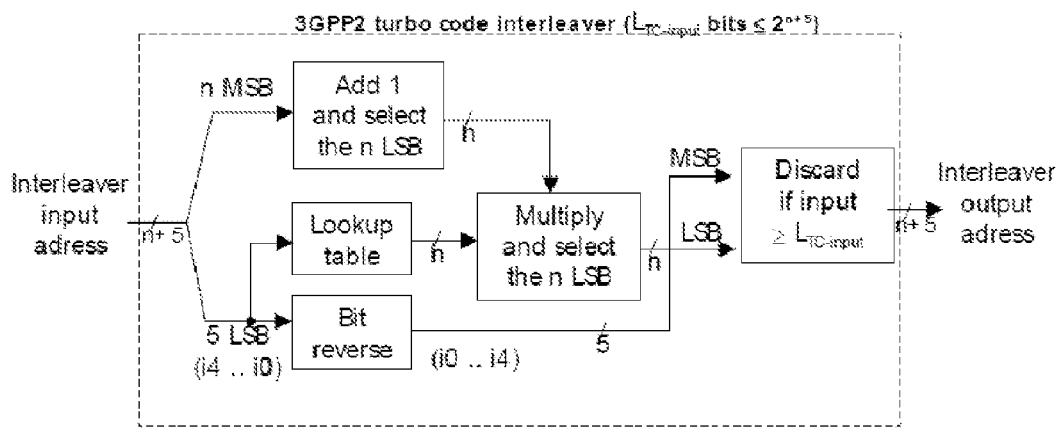

Different standards specify turbo interleaving schemes that vary largely. Below, the turbo interleaving schemes of a few standards are given as example. FIG. 7 specifies the 3GPP2 interleaver that is used for CDMA2000, DVB-SH, ETSI-SDR and MediaFlo.

Although the interleave address generation is shared between the standards in this case, the different standards do specify different block sizes. The block sizes concerned are given in the table below.

| Standard | Block size | n |
| --- | --- | --- |
| ETS-SDR | 762 | 5 |
| MediaFlo | 994 | 5 |
| DVB-SH | 1146 | 6 |
| ETSI-SDR, DVB-SH | 12282 | 9 |
| CDMA2000 | 378, 570, . . . , 12282, 20730 | 4, 5, 6, 7, 8, 9, 10 |

Figure 8:
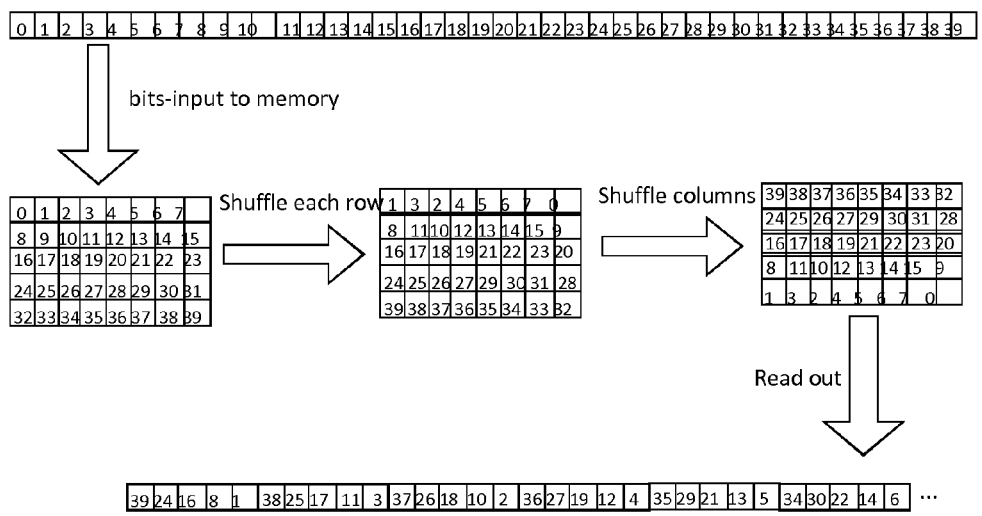

FIG. 8 illustrates the UMTS turbo interleaver. The UMTS turbo interleaver specifies a block interleaving where data is written in rows and read from columns of a (hypothetical) matrix. Both the rows and columns of the matrix are furthermore shuffled. The shuffling of the rows is given with the parameter T that is defined in the standard. The shuffling of the columns is given by the parameters Ui (for column i, different for each column). In this case, the block size can take any value between 40 and 5144. Maximum number of rows is 20 and maximum number of columns is 256.

The UMTS LTE turbo interleaver can be described by means of the equation $\Pi(i)=(f_1 \cdot i+f_2 \cdot i^2) \mod K$, where $\Pi(i)$ denotes the index of the i'th interleaved symbol. The parameters $f_1$ and $f_2$ depend on the block size K and are given in the standard. The block size takes different values from 40 to 6144.

FIG. 1 is a block diagram schematically illustrating a reconfigurable interleaver 100 according to the invention. Interleaver 100 comprises a plurality of reconfigurable counters, shown are a reconfigurable counter 111 and a reconfigurable counter 121. Interleaver 100 comprises a plurality of memories, shown are memory 112 and memory 122. Interleaver 100 comprises a computational element, shown is one computational element 130. Interleaver 100 may comprise more counters, memories than shown in FIG. 1, e.g., 2, 3, or more. Interleaver 100 may comprise exactly one computational element, or more than 1, e.g., 2, 3, or more.

Memory 112 is associated with counter 111. Memory 122 is associated with counter 121. It is convenient, though not needed, if the plurality of memories and the plurality of counters are organized in pairs, each memory being associated with exactly one of the counters, forming a plurality of pairs, each pair comprising one memory and one counter, which are associated with each other.

The plurality of counters are configurable. It is convenient if each counter can be configured independently from the other counters, but other constructions are possible. For example, all counters can be arranged to take their configuration simultaneously from a larger configuration table. A counter may comprise an input for receiving configuration data.

The counters count values. In an implementation, the counters count sequential integers. The values may also run through a more complicated sequence, for example, only the even numbers, if this would be convenient in an implementation. The counted integers may be directly representative for memory positions, i.e., addresses. On the other hand, they may also be indicative for memory addresses. For example, an operation may be needed on the counter, e.g., adding a base value to a counted value to obtain an address. The base value may be stored, e.g., in the memory, in the counter, etc.

Each counter can be configured with a total count number defining a number of values to count and with a start value defining a value from which to start counting. For example, a counter would count the values 'start value', 'start value+1', 'start value+2' until it reaches 'start value+total count number−1'. When the number of values counted equals total count number, the counter stops with its forward progression in the sequence of integers which it is counted. The value the counter has when it has counted total count number values, may be termed the end value. The sequence of values taken by the counter as it counts total count number values, starting from the start value typically consists of different values.

It has been found very convenient if the counter after having reached the end value automatically resumes counting from the start value. In this manner the counter for as long as it is operative, continues counting, repeating the sequence of total count number values starting at the start value, and ending with the end value. The counter may stop when it receives a stopping signal. The counter changes its behavior when it is reconfigured. For example, if it is reconfigured with a new start value, it will count starting from that value. For example, if it is reconfigured with a new total count number, it will count that number of values. Also both start value and total count number may be configured. It is noted, that for person skilled in the art, it makes no difference to configure using a start and an end value instead of using a start value and a total count number.

Memory 112 is configured to retrieve a value stored in a memory position of memory 112 as indicated by counter 111. When counter 111 is updated, memory 112 retrieves a new value. It is convenient to organize the interleave in a sequence of operating cycles, e.g., clock ticks. In each cycle a counter produces a value, and an associated memory retrieves a value. The memories may be RAM memory, so that their content may be updated. The memories may be ROM memory filled with the appropriate values during production.

It is noted that a memory may be set to a constant value by programming the counter with a total count number of 1.

Computational element 130 is connected to memory 112 and 122 to receive values retrieved from memories 112 and 122 in dependence on counters 111 and 121 respectively. Computational element 130 operates on the values. For example, computational element 130 may be a processor programmed to operate on the values. A fast implementation with a low footprint is obtained if computational element 130 is implemented in hardware and performs a hardwired operation, possibly under the influence of one or more configuration parameters.

It has been found convenient if the plurality of computational elements form a computational network, wherein the plurality of computational elements are interconnected to receive values from the plurality of memories, and to operate on the retrieved values and on intermediate results produced in the plurality of computational elements.

Computational element 130 may, e.g., be an adder, multiplier, or xor element to perform an addition, multiplication or xor operation, respectively.

During operation, the counters are configured by setting the parameters total counter number and start value, the memories are filled with the appropriate values. In sequence, the counters produce new values, in dependency upon which the memories retrieve new values. Finally the computing elements, produce values in dependency upon the retrieved values.

The computing element 130 also shows an output, indicating the result of the interleaving operation. Typically, in each cycle, all counters are signaled to advance, and one interleaved address is produced. It is noted that a counter may not advance, e.g., if its total count number is one. In some circumstances a cycle may not produce an interleaved address, for example, if the interleaver uses so-called invalid addresses. In that case, an invalid signal may be produced by the interleaver when an invalid address has been produced. An invalid address typically falls outside a predetermined range, e.g., the address is larger than the block length. When the system who uses the interleaver receives the invalid signal it instruct the decoding temporarily stalls and the interleaver is instructed to produce a new address.

Figure 2:
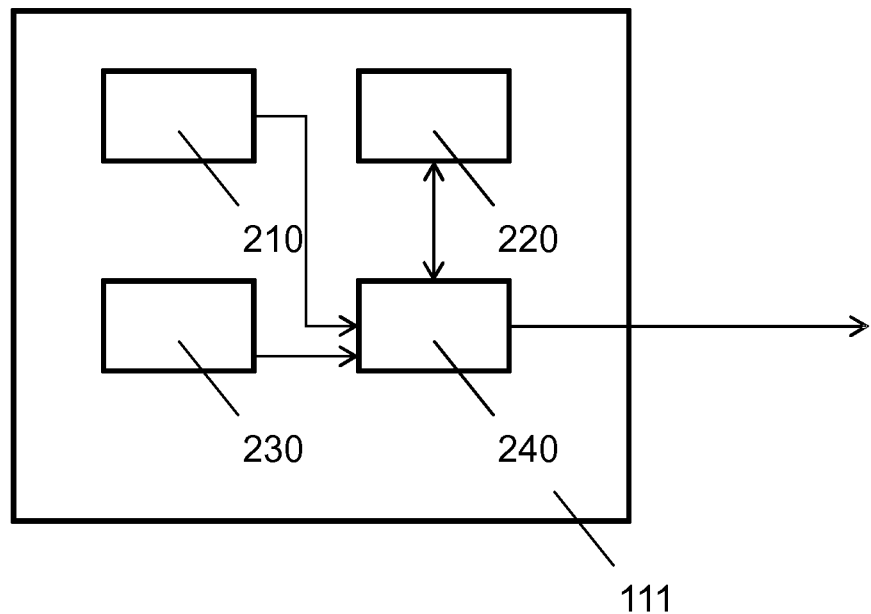
FIG. 2 is a block diagram illustrating a reconfigurable counter.

FIG. 2 shows a possible embodiment of reconfigurable counter 111. The other counters in the plurality of reconfigurable counters may be implemented similarly.

In this particular embodiment, counter 111 comprise a register 220 storing a current value of the counter, advancing means 240 for advancing register 220, two further registers: a total count number register 210 and a start value register 230. The advancing means 240 may comprise an input for receiving a signal that the counter is to be advanced. For example, the advancing means may receive a clock signal, for advancing the counter at each clock tick. Advancing means 240 receives the values in registers 210 and 230 and the current count value from register 220. Advancing means adds one to the value in register 220 and compares the new value in register 220 with the sum of the values in registers 210 and 230. If the values are equal, the value in register 220 is changed to the start value, stored in register 230. The value stored in the current value register 220 is outputted to an associated memory, e.g., memory 112. Alternatively, the value is retrieved from register 220 when needed.

The embodiment shown in FIG. 1 or 2 may be implemented in an IC, e.g., in CMOS technology.

Figure 3:
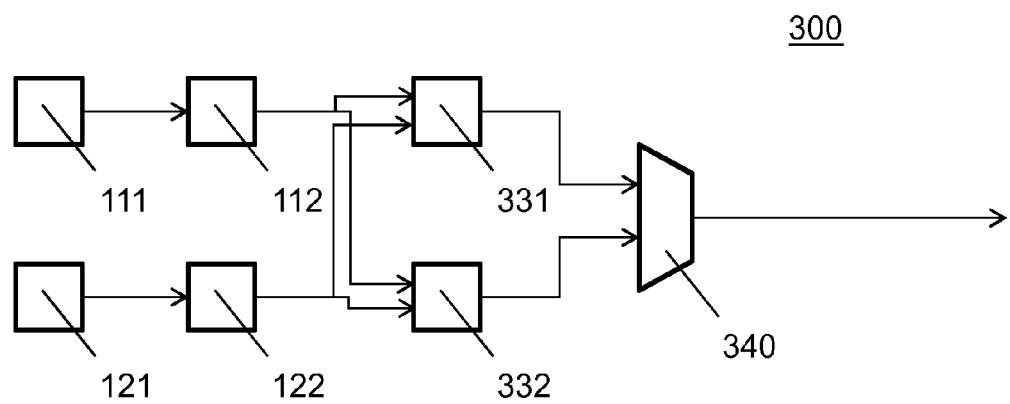
FIG. 3 is a block diagram illustrating a second embodiment of the reconfigurable interleaver according to the invention.

FIG. 3 is a block diagram schematically illustrating another aspect of a reconfigurable interleaver according to the invention. FIG. 3 shows an interleaver 300 which is an elaboration of interleaver 100.

Interleaver 300 comprises counters 111 and 121, memories 112 and 122 as in FIG. 1. FIG. 3 further shows two computational elements, computational element 331 and computational element 332. Computational element 331 and computational element 332 each receive values from memories 112 and 122. Typically, Computational element 331 and computational element 332 are configured to operate upon the received value in a different way.

Interleaver 300 further comprises a selection element 340. Selection element 340 is connected to computational elements 331 and 332 to receive the value computed by those elements. Selection element 140 is configurable to forward one of the two values received from elements 331 and 332 respectively to an output. For example, selection element 340 may be configured to receive a configuration bit, i.e., a selection bit, to configure selection element 340.

For example, selection element 340 may receive a selection bit indicating that the value received from element 331 is to be forwarded to the output. For example, selection element 340 may receive a different selection bit indicating that the value received from element 332 is to be forwarded to the output. It is convenient if the selection element has two inputs and one output, however, the selection element may also have more than 2 inputs, e.g., 3 or 4, or more, and the selection bit may take on a correspondingly larger number of values.

Selection elements are useful since they allow a choice between different computational element. For example, for some interleaving patterns it may be appropriate to perform the operation of computation element 331 instead of element 332.

Note that the operation of a computation element may be hardwired and fixed in its implementation, for example, fixed in an IC implementation.

Figure 4:
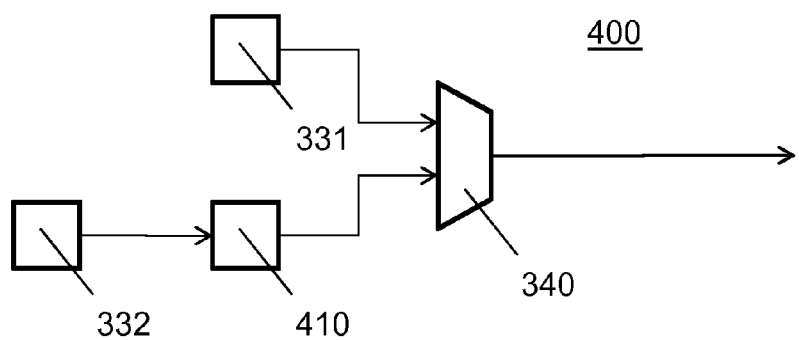
FIG. 4 is a block diagram illustrating a third embodiment of the reconfigurable interleaver according to the invention.

FIG. 4 is a block diagram schematically illustrating another aspect of a reconfigurable interleaver according to the invention. FIG. 4 shows an interleaver 400 which is an elaboration of interleaver 100 and/or 300.

Interleaver 400 comprises a computational element 332 and 331 and a selection element 340 as in FIG. 3. However, computational element 332 is connected to an input of selection element 340 via a buffer 410. Buffer 410 has an input for receiving a value and an output for outputting a value. Buffer 410 simply forwards his input to its output, however it keeps the value for a certain number of cycles before outputting it. For example, the value received by buffer 410 may be outputted in the next cycle for use in the computation of a next interleaved address.

Preferably, buffer elements are configurable with an initial value. During calculation of the first interleaved address the buffer would output its configured initial value. During the calculation of the next interleaved address, the value buffered during the previous cycle is used. A buffer configured to buffer multiple value may be configured with a corresponding number of initial values.

Figure 5:
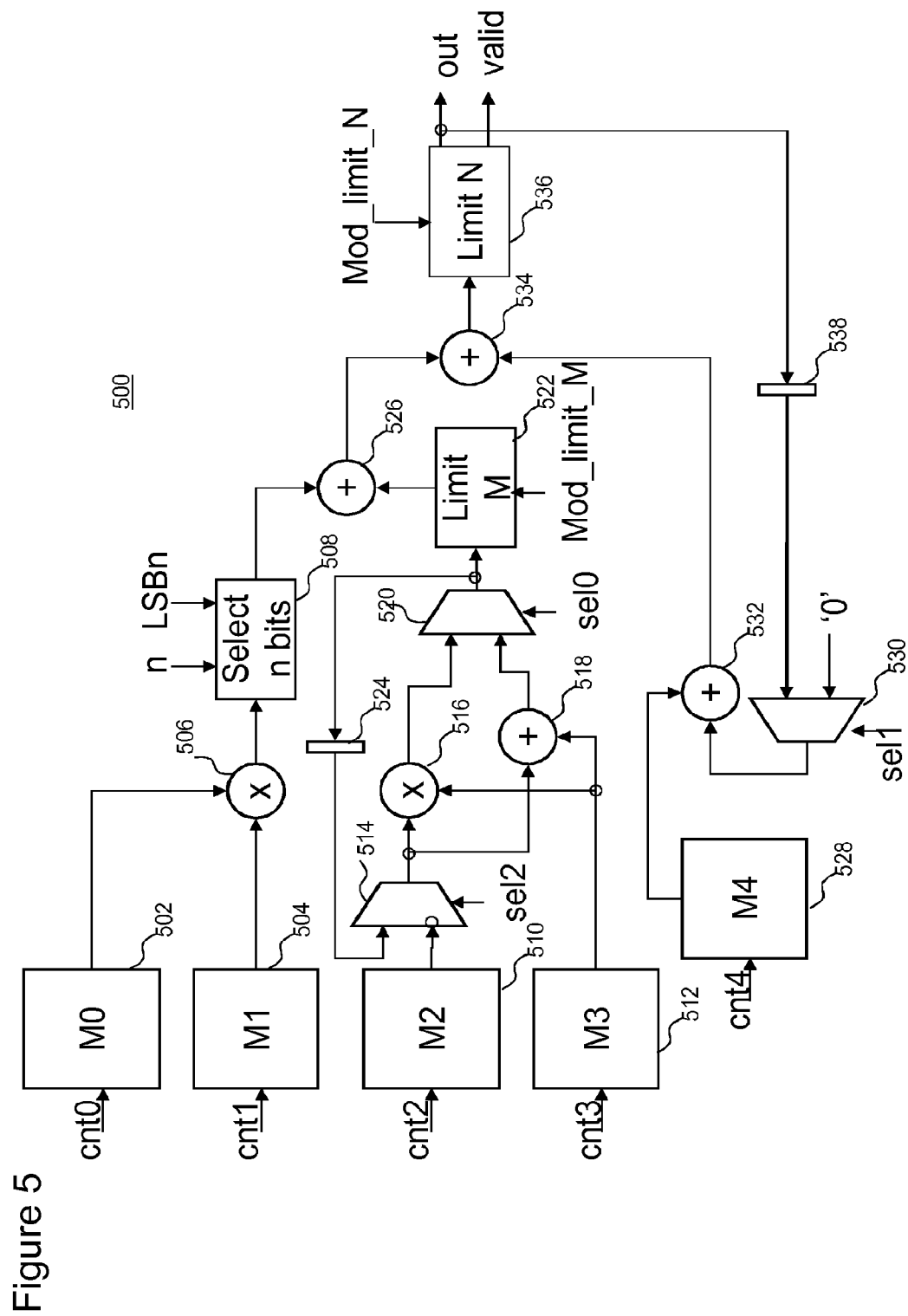
FIG. 5 is a block diagram illustrating a fourth embodiment of the reconfigurable interleaver according to the invention.

FIG. 5 illustrates reconfigurable interleaver 500. Interleaver 500 may be implemented using the elements described above for interleavers 100, 300 and 400. Apart from buffers and selection elements, Interleaver 500 uses a few computational elements which are not yet described and which are also of use in other interleavers, e.g, limit elements and bit selector elements.

For convenience we will describe interleaver 500 in three sections. Each section represents a way to combine reconfigurable counters and computational elements and is of independent merit. We will further show how, by reconfiguring the counters and elements of interleaver 500, the interleaver can support a large number of interleaving patterns. The sections are not indicated as such in FIG. 5.

The reconfigurable counters themselves are not shown in FIG. 5, instead each memory has as an input the output of a counter (either directly or indirectly).

The first section of interleaver 500 comprises a memory 502 (M0) associated with a counter 0 (indicated as cnt0), a memory 504 (M1) associated with a counter 1 (cnt1), a multiplier 506 and a bit selector 508. Bit selector 508 may be configured with two parameters a number of bits 'n', and an LSB indication. Having the LSB indication set, e.g., '1', configures the bit selector 508 to select the 'n' least significant bits from the input of bit selector 508. Having the LSB indication reset, e.g., '0', configures the bit selector 508 to select the 'n' most significant bits from the input of bit selector 508. By setting the number of bits to select equal to the word length used in the interleaver, the effect of the bit selection can be avoided. For example, the number of bits to select may be set to 16, if the number bits in an address is also 16.

In the first section, memory 502 and memory 504 are both connected to multiplier 506. Multiplier 506 is configured to multiply the inputs. In this embodiment, multiplier 506 is an arithmetical multiplication; however, in other embodiments of the interleaver, a multiplication over a finite field may be used. The output multiplier 506 is connected to bit selector 508, so that a number of bits may be selected from the result of a multiplication.

The second section of interleaver 500 comprises a memory 510 (M2) associated with a counter 2 (indicated as cnt2), a memory 512 (M3) associated with a counter 3 (cnt3), selection element 514, multiplier 516, adder 518, selection element 520, limit element 522 and buffer 524.

Selection element 520 receives input values from multiplier 516 and from adder 518. Selection element 520 can be configured with a selection bit, indicated with 'sel0'. In this embodiment, when sel0 is 0 the input shown lowest is selected, i.e., the input received from adder 518, if sel0 is 1 the other input is selected, i.e., the input received from multiplier 516. By configuring selection element 520, it may be determined if the elements operating on the output of selection element 520 work on an addition result or on a multiplication result. Limit element 522 receives as input the output of selection element 520.

Limit elements, such as limit element 522, compare their input value, i.e., the limit input value, to a limit value. The limit element may be configured to perform pure limiting, e.g., not forwarding a result if the input is larger than the limit value, or to perform a modulo operation using the limit value as modulus. The modulo operation may be implemented as a simple subtraction, if the interleaving algorithm allows this, that is, if the limit input value will never be twice the limit value or larger.

Limit element 522 is configured to receive a limit bit, indicated with Mod_limit_M. If the limit bit is 0, a limit operation is performed, if the bit is 1 a modulo operation is performed. The limit element 522 may also be configured with a limit value (shown as 'M' in FIG. 5). The limit value of a limit element is typically chosen as the block length of the interleaver (also referred to a 'Blength'). By choosing the limit value, e.g., M, to be the maximum value that is expressible in the used word length of the values (also referred to a MAXVAL), the effect of the limit element may be avoided. For example, if the number of bits used is 16, then MAXVAL may be set to $2^{16}-1$.

If limit element 522 has to discard an element, that is if it is programmed for limiting it will discard a predetermined number of the most significant bits of the input value.

The output of selection element 520 is also connected to buffer 524. Buffer 524 keeps the received value and outputs it during the computation of the next interleaved address.

Selection element 514 receives input values from buffer 524 and from memory 510. Selection element 514 can be configured with a selection bit, indicated with 'sel2'. In this embodiment, when sel2 is 0 the input shown lowest is select, i.e., the input received from memory 510, if sel2 is 1 the other input is selected, i.e., the input received from buffer 524. By configuring selection element 514, it may be determined if the elements operating on the output of selection element 514 work on an value retrieved from a memory or on a previous result stored in buffer 524.

Multiplier 516 and adder 518 each receive as input the output of selection element 514. Multiplier 516 and adder 518 also each receive as input the value retrieved from memory 512. In other words multiplier 518 and adder 516 operate on the same input values. Nevertheless, selection element 520 determines which one of the two results, the addition or the multiplication is used in a computation after selection element 520, e.g., in limit element 522.

Interleaver 500 comprises an adder 526. The output of the first section, i.e., the output of bit selector 508 and the output of the second section, i.e., the output of limit element 522 are received as inputs in adder 526 which produces their sum.

The third section of interleaver 500 comprises a memory 528 (M4) associated with a counter 4 (indicated as cnt4), an adder 532, a selection element 530 and a buffer 538.

Buffer 538 is configured to receive the output of the interleaver 500, that is from limit element 536 which is described below. Buffer 538 stores the value intermediately, for use in a next interleaver address computation.

Selection element 530 receives two input values, one from buffer 538 and one input value is fixed to '0'. Selection element 530 can be configured with a selection bit, indicated with 'sel1'. In this embodiment, when sel1 is 0 the input shown lowest is selected, i.e., the value 0 is used, if sel1 is 1 the other input is selected, i.e., the input received from buffer 538. By configuring selection element 530, it may be determined if the elements operating on the output of selection element 530 work on the value 0 or on a previous result stored in buffer 538.

Adder 532 receives as input the output of selection element 530, and the value retrieved from memory 528.

Interleaver 500 comprises an adder 534 and a limit element 536. The output of the third section, i.e., the output of adder 532 and the addition of the first and second section, i.e., the output of adder 526 are received by adder 534.

The output of adder 534 is an input for limit element 536.

Limit element 536 is configured to receive a limit bit, indicated with Mod_limit_N. If the limit bit is 0, a limit operation is performed, if the bit is 1 a modulo operation is performed. The limit element 536 may also be configured with a limit value (shown as 'N' in FIG. 5).

Limit element 536 has a further output, indicating if the produced address is a valid interleave address (indicated in FIG. 5 as 'out'). If the limit element 536 is configured for the limiting (as opposed to modulo operations), the limit element compares its input to the block size and generates a valid high if it is smaller than block size or a valid low if it exceeds the block size. The valid low and valid high information may be used by a turbo decoder to stall the decoding if no valid address is available.

The modulo function, on the other hand, compares the generated value to the modulo value (usually the block size) and subtracts the modulo value from the output value when the output value exceeds the modulo value. The limiting/modulo units can be configured for either limiting or modulo behavior. In case the modulo operation is configured, the limit element 536 always produces a valid indication as its valid output.

Interleaver 500, is a compact look-up-table (LUT)-based programmable interleaver. The LUT data is distributed between five memories, M0, M1, M2, M3 and M4. Each memory is addressed by means of a counter. Memories are connected to two multipliers and two adders as seen in the diagram (adders 532, 518 and multipliers 506 and 516). The output of these units can in turn be added up to form the final result.

The first (top) section, using data from M0 and M1, can do only multiplication. Second section, connected to M2 and M3 can do either a multiplication or an addition. Third section, can pick data from M4 and has an option to add it up to the last generated address. Furthermore, there are 'limiting units' included, to support standards that have modulo or limiting functions.

The interleaver may be programmed, by any one of: copying new LUT values into memories M0 to M4, setting up the values required for the counters cnt0 to cnt4, and other control values (parameters) such as select signals (sel0, sel1 and sel2) and modulo or limiting values (M, N, Mod_limit_N and Mod_limit_M).

The programming of the interleaver need be done once, before a decoding starts, and as long as the block size is not changed the same values can be reused.

The computational elements form a computing network comprising a plurality of computational elements configured to operate on the values retrieved from the plurality of memories.

In the table below control values are given to configure the interleaver for a variety of standards.

| Standard | | DVB-SH | DVB-SH | ETSI-SDR | MediaFlo | 3G | 3G | 3G | LTE |
|---|---|---|---|---|---|---|---|---|---|
| Block size Blength | | 1146 | 12282 | 762 | 994 | 50 | 500 | 5000 | all Blength |
| cnt0 | init | 0 | 0 | 0 | 0 | 32 | 37 | 47 | 67 |
| | rep | 32 | 32 | 32 | 32 | 5 | 10 | 20 | 1 |
| | inc | 1 | 1 | 1 | 1 | 1 | 1 | 1 | 0 |
| | lim | 32 | 32 | 32 | 32 | 37 | 47 | 67 | 68 |
| cnt1 | init | 0 | 32 | 64 | 64 | 96 | 96 | 96 | 97 |
| | rep | 32 | 32 | 32 | 32 | 1 | 1 | 1 | 1 |
| | inc | 1 | 1 | 1 | 1 | 0 | 0 | 0 | 0 |
| | lim | 32 | 64 | 96 | 96 | 97 | 97 | 97 | 98 |
| cnt2 | init | 0 | 0 | 0 | 0 | 32 | 82 | 582 | 5582 |
| | rep | 32 | 32 | 32 | 32 | 50 | 500 | 5000 | 1 |
| | inc | 1 | 1 | 1 | 1 | 1 | 1 | 1 | 0 |
| | lim | 32 | 32 | 32 | 32 | 82 | 582 | 5582 | 5583 |
| cnt3 | init | 0 | 0 | 0 | 0 | 1 | 1 | 1 | 2 |
| | rep | 1 | 1 | 1 | 1 | 1 | 1 | 1 | 1 |
| | inc | 0 | 0 | 0 | 0 | 0 | 0 | 0 | 0 |
| | lim | 1 | 1 | 1 | 1 | 2 | 2 | 2 | 3 |
| cnt4 | init | 0 | 0 | 0 | 0 | 0 | 0 | 0 | 1 |
| | rep | 1 | 1 | 1 | 1 | 1 | 1 | 1 | 1 |
| | inc | 0 | 0 | 0 | 0 | 0 | 0 | 0 | 0 |
| | lim | 1 | 1 | 1 | 1 | 1 | 1 | 1 | 2 |
| Additional memory size required (# of 8 bit words) | M0 | 32 | 0 | 0 | 0 | 5 | 10 | 20 | 1 |
| | M1 | 32 | 32 | 32 | 0 | 1 | 0 | 0 | 1 |
| | M2 | 32 | 0 | 0 | 0 | 50 | 500 | 5000 | 1 |
| | M3 | 1 | 0 | 0 | 0 | 0 | 0 | 0 | 1 |
| | M4 | 1 | 0 | 0 | 0 | 0 | 0 | 0 | 1 |
| n | | 6 | 9 | 5 | 5 | 16 | 16 | 16 | 16 |
| LSBn | | 1 | 1 | 1 | 1 | 1 | 1 | 1 | 1 |
| sel0 | | 1 | 1 | 1 | 1 | 0 | 0 | 0 | 1 |
| sel1 | | 0 | 0 | 0 | 0 | 0 | 0 | 0 | 1 |
| sel2 | | 0 | 0 | 0 | 0 | 0 | 0 | 0 | 1 |
| Mod_limit_M | | 0 | 0 | 0 | 0 | 0 | 0 | 0 | 0 |
| M | | B_length | B_length | B_length | B_length | B_length | B_length | B_length | MAXVAL |
| Mod_limit_N | | 0 | 0 | 0 | 0 | 0 | 0 | 0 | 1 |
| N | | MAXVAL | MAXVAL | MAXVAL | MAXVAL | MAXVAL | MAXVAL | MAXVAL | B_length |

The parameters for programming the different standards on programmable interleaver use the following conventions: select=0 selects the lower MUX input, Mod_limit=0 selects limit operation and Mod_limit=1 selects modulo operation.

This table describes for each counter and for a number of standards for interleaving patterns, how the counter may be configured. Indicated are an init value, i.e., a start value, a rep value, i.e., a total count number with a repeating counter, inc, a number indicating how much the counter must be advanced, and lim, a value indicating the end value.

Furthermore, the amount of additional memory is indicated, to support additional interleaving standards. By removing interleaving standards, the memory requirements reduce.

For this example, no reuse of memory space is assumed, but this is possible.

Starting from DVB-SH, additional memory required for each new standard has been given. Note that the sizes of the LUT's for various standards. As can be seen, although the DVB-SH turbo interleaver has a maximum block size of 12282, requiring a LUT of 14 bits×12282 words, the interleaver requires only the small LUT's which have a total of 8 bits×162 words. This can be even more extreme for other standards, for example, CDMA2000, which is not included in the table would originally require 15 bits×20000 words, while the same amount of (8 bits×162 words) memory can be used to implement it.

Note that the DVB-SH standard supports two differing block sizes (Blength), 1146 and 12282. These two block sizes require different values to be used (cf. the standard). Accordingly, the counter (cnt1) has different start values for the two types of interleaving.

For some standards, larger sizes of LUT's may be needed, however, even in this case the LUT size is less than what would be required for a solution completely based on look up tables. For example, UMTS turbo interleaver requires a LUT size of 8 bits×5200 words. However, in the case of a LUT-based solution this would have been 13 bits×5144 words.

For the set of standards given in the above table, the total memory sizes then become:
M0: 68×8 bits
M1: 98×8 bits
M2: 5583×8 bits
M3: 2×8 bits
M4: 2×8 bits Based on these numbers, design decisions can be made, such as implementing the smaller memories as register files and including embedded memories for the larger ones. Furthermore, some flexibility can be included such that the processing units can read from multiple memories, although this makes the control somewhat more complex it further reduces memory requirements.

As a result, we have a configurable interleaver that supports multiple standards and is relatively small. It is also very likely to support new standards not known at this point in time.

The invention comprises both dedicated hardware for the interleaver and the memories for look up tables.

The values in the memories may be predetermined, e.g., during manufacture, in which case the memories may be made as ROM. To further reduce the required memory size, or to increase the flexibility the memory content may also be calculated when needed. For example, a processor can calculate the values for the memories. The processor may be shared for other applications, for example, the processor may run mobile phone software to support telecommunication. Because the LUT memory is small and only a small fraction of the calculation needs to be done on the processor, the calculation time is small compared to a solution based only on a look up table.

The table below lists an example content of the memory to support the interleaving parameters given in the table above.

| Memory contents per standard | DVB-SH | ETSI-SDR | MediaFlo | 3G | LTE |
|---|---|---|---|---|---|
| M0 | $1, 2, 3, \ldots, 2^{(n-1)}, 0$ | $1, 2, 3, \ldots, 2^{(n-1)}, 0$ | $1, 2, 3, \ldots, 2^{(n-1)}, 0$ | T | $\text{floor}((f_1 + f_2)/4)$ |
| M1 | $LUT0, LUT1, \ldots, LUT31$ | $LUT0, LUT1, \ldots, LUT31$ | $LUT0, LUT1, \ldots, LUT31$ | C | 4 |
| M2 | $0, 16, 8, \ldots, 31$ | $0, 16, 8, \ldots, 31$ | $0, 16, 8, \ldots, 31$ | column permutation matrix U | 0 |
| M3 | $2^n$ | $2^n$ | $2^n$ | 0 | $2f_2$ |
| M4 | 0 | 0 | 0 | 0 | $(f_1 + f_2) - \text{floor}((f_1 + f_2)/4)$ |

The parameters n, T, C, f1, f2, and LUTx are given in the standard documents referred to above. The parameter U may be calculated by the host computer given the calculation rules in the standard 3GPP.

For example, to support a DVB-SH standard. The memory M1 is filled with a look up table as defined in the standard (LUTx), while M0 is filled with the values of 1, 2 and sequentially up to $2^{(n-1)}$ followed by 0 (these values correspond to the 'add 1 and select the n LSB' block in FIG. 7).

M2 contains the values of 0 up to $2^5-1$, bit reversed. Since sel2 is 0 and sel0 is 1, the result of the multiplier 536 is used, and the buffer 524 is avoided. In effect section 2 computes a multiplication with a power of 2. The limit element 522 then performs the final limit operation. Note that since limit element 536 is set to limit on MAXVAL it has not effect on the outcome.

Since sel1 is 0 selection element outputs a 0, and since M4 will only retrieve a 0 the third section as no influence on the addition performed in adder 534.

If later one wants a different interleaving pattern of the DVB-SH family only a few parameters need be changed, as indicated in the table above.

The interleaver may be used in the physical layer processing for broadcast reception, wireless networking or wireless communication. Using the described interleaver, a very flexible turbo decoder can be built at minimal cost. This invention describes a flexible turbo interleaver supporting most known broadcasting and mobile communication standards. The (de-)interleaver is estimated to occupy around 30% of the area of a LUT-based solution that would support the same group of standards. Furthermore, as much of the calculation can be done within this interleaver unit, the computation time required from the host processor is reduced significantly.

Figure 6:
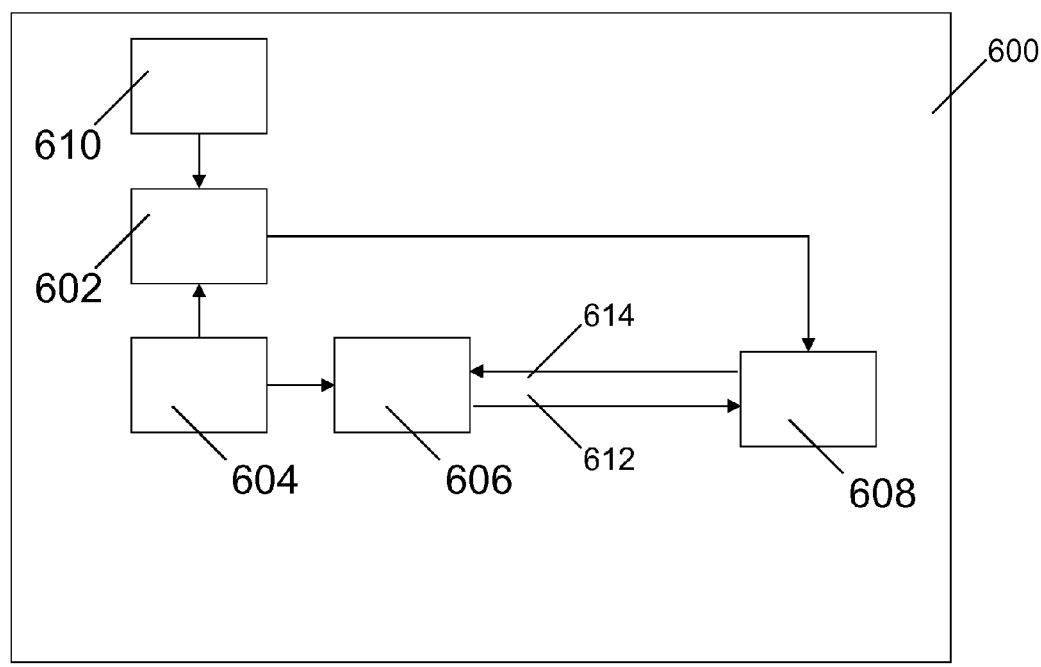
FIG. 6 is a block diagram showing an embodiment of a decoding system according to the invention, FIG. 7 specifies the 3GPP2 interleaver, FIG. 8 specifies the UMTS turbo interleaver.

In FIG. 6 an embodiment of a decoding system 600 is shown. The decoding system 600 may be part of a data processing system.

Data processing system 601 comprises decoding system 600. Decoding system 600 comprises an interleaver 602, a controller 604, a decoder 606, a memory 608 and a reconfiguration means 610. Decoding system 600 is suitable for decoding a turbo code.

Decoder 606 is typically a SISO type decoder. Decoder 606 is connected to a memory 608, via connections 612 and 614. The connection 614 is used by decoder 606 for reading from memory 608 in response to an address. The connection 612 is used by decoder 606 for writing to memory 608. For ease of exposition the connection for writing and reading are indicated in FIG. 6 with separate reference signs, 612 and 614, although typically the connection from decoder 606 to memory 608 will be executed as a single connection, which single connection can be used both for reading and writing.

For example, such a single connection may be executed as a bus.

Decoder 606 receives addresses from an interleaver 602, for reading from memory 608. Controller 604 controls the interleaver 602 and the decoder 606. Interleaver 602 is reconfigurable using reconfiguration means 610.

During operation, the decoding system 600 receives a frame comprising data and redundancy, i.e. error correcting information. The frame can be stored in memory 608 or an additional input buffer memory. Decoder 606 corrects the errors that may be present in the frame, in a number of iterations. Each such iteration comprises a first half-iteration and a second half-iteration.

In a first half-iteration the decoder 606 reads data from memory 608 using connection 614. The reading is typically done sequentially and does not necessarily need addresses generated by interleaver 602. Next, decoder 606 proceeds with correcting the data. When decoder 606 is finished with this correcting step, the corrected data produced by decoder 606 is written to memory 608 using connection 612. The writing is done sequentially and does not necessarily need addresses from interleaver 602.

In a second half-iteration, the decoder 606 reads data from memory 608 using connection 614. The reading is done from interleaved addresses that are, at least partially, supplied by interleaver 602. Next, decoder 606 proceeds with correcting the data. When decoder 606 is finished with this correcting step, the corrected data produced by decoder 606 is written to memory 608 using connection 612. The writing is done sequentially and does not necessarily need addresses from interleaver 602.

Producing addresses and correcting data may be combined. For example, one or more addresses may be produced after which some progress on correcting is made, next one or more further addresses may be produced after which some further progress on correcting is made, and so on, until all addresses are produced and all correcting steps of a particular half-iteration are done.

Processing of a half-iteration typically takes a number of clock cycles. In each clock cycle, the decoder 606 needs a new information item from memory 608 to work on. This is not necessary though, decoding system 600 may also work asynchronously, without using a clock.

In this way, reading using connection 614 is done sequentially in first half-iterations and according to addresses supplied by interleaver 602 in second half-iterations. Note that alternatively, the roles of first and second half-iteration could be reversed, i.e. with the first half-iteration using interleaved addresses and the second half-iteration using linear addresses.

The number of iterations can be determined both statically and dynamically, using a so-called stopping rule. An overview of stopping rules is provided by "Stopping Rules for Turbo Decoders"; TMO progress report 42-142; Aug. 15, 2000; A. Matache, S. Dolinar and F. Pollara. For example, the stopping rule definitions from Section II may be used.

The reconfiguration means 610 and interleaver 602 may be implemented according to any one of the further embodiments, discussed below.

Recently, parallel turbo decoder architectures were introduced. A parallel turbo decoder architecture employs multiple SISO decoders to work in parallel on the same received data frame. With a parallel turbo decoder a conflict-free interleaver is typically used. Conflict-free interleavers are described, for example, in Neeb, C., Thul, M. J. and Wehn, N, 2005, "Network-on-chip-centric approach to interleaving in high throughput channel decoders", *Circuits and Systems*, ISCAS 2005, IEEE International Symposium on 23-26 May 2005, page(s): 1766-1769 Vol. 2. The invention may also be applied to a parallel turbo decoder.

Figure 9:
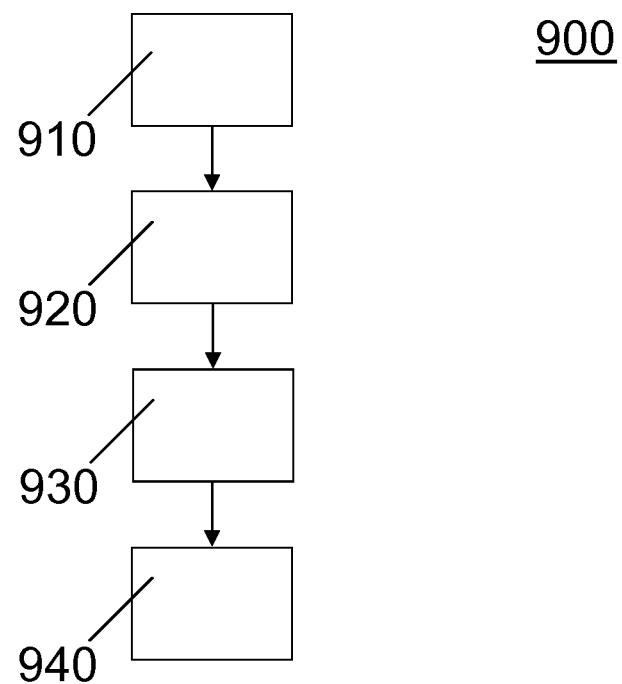
FIG. 9 shows a flowchart illustrating a method according to the invention.

FIG. 9 shows a flow chart illustrating a method 900 according to the invention.

The flowchart shows configuring 910 a plurality of counters with a total count number defining a number of values to count and with a start value defining a value from which to start counting, retrieving 920 values from a plurality of memories, a value being retrieved from a memory position in a memory indicated by a counter of the plurality of counters associated with the memory, operating 930 on the values retrieved from the plurality of memories, and producing 940 a sequence of interleaved addresses, a next one of the interleaved addresses in the sequence of interleaved addresses being obtainable by advancing at least one counter of the plurality of counters and by operating of the computational elements on at least a value retrieved from a memory associated with the advanced counter.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. For example, step 640 may be executed, at least partially, in parallel with the other steps. Moreover, a given step may not have finished completely before a next step is started.

Preferably, the method is executed using hardware dedicatedly configured for executing the method. For example, the method may use a hardware implemented reconfigurable interleaver, e.g. implemented in CMOS technology. For example, one or more of the plurality of counters, and/or plurality of memories and/or plurality of computational elements may be implemented in dedicated hardware. Dedicated hardware is hardwired for performing its particular function.

However, software may be used in conjunction with the method. For example, software may control the reconfiguring, for example by writing data to the memories, or configuring the counters.

A method according to the invention may be executed or controlled or reconfigured using software, which comprises instructions for causing a processor system to perform method 900. Software may only include those steps taken by a particular sub-entity of the system. The software may be stored in a suitable storage medium, such as a hard disk, a floppy, a memory etc. The software may be sent as a signal along a wire, or wireless, or using a data network, e.g., the Internet. The software may be made available for download and/or for remote usage on a server.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. It will also be appreciated that such a program may have many different architectural designs. For example, a program code implementing the functionality of the method or system according to the invention may be subdivided into one or more subroutines. Many different ways to distribute the functionality among these subroutines will be apparent to the skilled person. The subroutines may be stored together in one executable file to form a self-contained program. Such an executable file may comprise computer executable instructions, for example, processor instructions and/or interpreter instructions (e.g. Java interpreter instructions). Alternatively, one or more or all of the subroutines may be stored in at least one external library file and linked with a main program either statically or dynamically, e.g. at run-time. The main program contains at least one call to at least one of the subroutines. Also, the subroutines may comprise function calls to each other. An embodiment relating to a computer program product comprises computer executable instructions corresponding to each of the processing steps of at least one of the methods set forth. These instructions may be subdivided into subroutines and/or be stored in one or more files that may be linked statically or dynamically. Another embodiment relating to a computer program product comprises computer executable instructions corresponding to each of the means of at least one of the systems and/or products set forth. These instructions may be subdivided into subroutines and/or be stored in one or more files that may be linked statically or dynamically.

The carrier of a computer program may be any entity or device capable of carrying the program. For example, the carrier may include a storage medium, such as a ROM, for example a CD ROM or a semiconductor ROM, or a magnetic recording medium, for example a floppy disc or hard disk. Furthermore, the carrier may be a transmissible carrier such as an electrical or optical signal, which may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. However, the scope of the herein disclosed subject matter is determined by the claims.

The invention claimed is:

1. A reconfigurable interleaver, comprising:
   a plurality of counters, each said counter being configurable with a total count number defining a number of values to count and with a start value defining a value from which to start counting,
   a plurality of memories, each said memory being configured to retrieve values from memory positions in the memory indicated by a counter of the plurality of counters associated with the memory, and
   a plurality of computational elements configured to operate on the values retrieved from the plurality of memories,
   a configurable limit element, the limit element being configured to receive a limit bit and a limit value and to receive a limit input value,
   wherein, the reconfigurable interleaver is configured to produce a sequence of interleaved addresses, a next one of the interleaved addresses in the sequence of interleaved addresses being obtainable by advancing at least one counter of the plurality of counters and by operating at least one of the computational elements on at least a value retrieved from a memory associated with the advanced counter,
   wherein, by reconfiguring at least one of the counters with at least one of the total count number and the start value, the reconfigurable interleaver is configured for one of at least two different interleaving patterns,
   wherein the limit element is configured to perform and output a modulo operation upon the limit input value using the limit value as modulus for one value of the limit bit,
   wherein the limit element is configured to perform a limiting operation upon the limit input value using the limit value as limit, outputting the limit input value if the limit input value is smaller than the limit value, for one other value of the limit bit, and
   wherein the configuring of the reconfigurable interleaver for one of the at least two different interleaving patterns is further in dependency upon one of the limit bit and the limit value.

2. A reconfigurable interleaver as in claim 1, wherein at least one said counter is configured, after having counted total count number values, to repeat the counting starting from the start value.

3. A reconfigurable interleaver as in claim 1, wherein, a computational element is configured to receive two values retrieved from two different memories, and is configured to produce a value by operating upon the two retrieved values.

4. A reconfigurable interleaver as in claim 1, comprising at least one selection element, wherein the selection element is configured to receive a selection bit, to receive two values and to output one of the two values in dependency upon the selection bit,
at least one of the plurality of the computational elements is configured to receive as an input the output of the selection element, or the selection element being configured to receive one of its two input values from the computational element, and
the configuring of the reconfigurable interleaver for one of the at least two different interleaving patterns is further in dependency upon the selection bit.

5. A reconfigurable interleaver as in claim 1, further comprising a buffer element, for receiving a value ad to output the value for operating upon by the computational elements to obtain a next one of the interleaved addresses in the sequence of interleaved addresses.

6. A turbo encoder or decoder comprising a reconfigurable interleaver as in claim 1.

7. A method of reconfiguring an interleaver, comprising:
   configuring a plurality of counters with a total count number defining a number of values to count and with a start value defining a value from which to start counting,
   retrieving values from a plurality of memories, a value being retrieved from a memory position in a memory indicated by a counter of the plurality of counters associated with the memory,
   operating on the values retrieved from the plurality of memories,
   receiving a limit bit and a limit value at a configurable limit element,
   receiving a limit input value at the configurable limit element,
   producing a sequence of interleaved addresses, a next one of the interleaved addresses in the sequence of interleaved addresses being obtainable by advancing at least one counter of the plurality of counters and by operating at least one of the computational elements on at least a value retrieved from a memory associated with the advanced counter,
   wherein by reconfiguring at least one of the counters with at least one of the total count number and the start value, the reconfigurable interleaver is configured for one of at least two different interleaving patterns
   performing and outputting a modulo operation upon the limit input value using the limit value as modulus for one value of the limit bit,
   performing a limiting operation upon the limit input value using the limit value as limit, outputting the limit input value if the limit input value is smaller than the limit value, for one other value of the limit bit, and
   wherein the configuring of the reconfigurable interleaver for one of the at least two different interleaving patterns is further in dependency upon one of the limit bit and the limit value.

8. A computer program product comprising computer program code stored on a non-transitory computer readable storage medium adapted to perform the method of claim 7 when the computer program code is run on a computer.

9. A reconfigurable interleaver, comprising:
   a plurality of counters, each counter to store:
      a total count number defining a number of values to count; and
      a start value defining a value from which to start counting;

a plurality of memories, each memory to retrieve values from memory positions in the memory indicated by a counter of the plurality of counters associated with the memory; and a plurality of computational elements to operate on the values retrieved from the plurality of memories, wherein a computational element to receive two values retrieved from two different memories, and to produce a value by adding or multiplying the two retrieved values;

wherein the reconfigurable interleaver to produce a sequence of interleaved addresses, a next one of the interleaved addresses in the sequence of interleaved addresses being obtainable by advancing at least one counter of the plurality of counters and by operating at least one of the computational elements on at least a value retrieved from a memory associated with the advanced counter; and wherein the reconfigurable interleaver is further operational for at least two different interleaving patterns by reconfiguring at least one of the counters with at least one of the total count number and the start value.

10. The reconfigurable interleaver as in claim 9, wherein at least one counter, after having counted total count number values, to repeat the counting starting from the start value.

11. The reconfigurable interleaver as in claim 9 wherein,
the computational element configured to receive two values is configured to produce the value by adding the two retrieved values, and
the reconfigurable interleaver being configured so that in one of the at least two different interleaving patterns, a counter associated with a memory having at least one zero is configured for the memory to retrieve only the zero value.

12. The reconfigurable interleaver as in claim 9 wherein,
the computational element configured to receive two values is configured to produce the value by multiplying the two retrieved values, and
the reconfigurable interleaver being configured so that in one of the at least two different interleaving patterns, a counter associated with a memory having at least one one ('1') value is configured for the memory to retrieve only the one value.

13. The reconfigurable interleaver as in claim 9, comprising at least one selection element, wherein:
the selection element is configured to receive a selection bit, to receive two values and to output one of the two values in dependency upon the selection bit,
at least one of the plurality of the computational elements is configured to receive as an input the output of the selection element, or the selection element being configured to receive one of its two input values from the computational element, and
the configuring of the reconfigurable interleaver for one of the at least two different interleaving patterns is further in dependency upon the selection bit.

14. The reconfigurable interleaver as in claim 9, further comprising a buffer element, for receiving a value and to output the value for operating upon by the computational elements to obtain a next one of the interleaved addresses in the sequence of interleaved addresses.

15. The reconfigurable interleaver as in claim 9, further comprising a configurable limit element, the limit element being configured to receive a limit bit and a limit value and to receive a limit input value, wherein:
the limit element is configured to perform and output a modulo operation upon the limit input value using the limit value as modulus for one value of the limit bit, and
the limit element is configured to perform a limiting operation upon the limit input value using the limit value as limit, outputting the limit input value if the limit input value is smaller than the limit value, for one other value of the limit bit, and
the configuring of the reconfigurable interleaver for one of the at least two different interleaving patterns is further in dependency upon one of the limit bit and the limit value.

16. The turbo encoder or decoder comprising a reconfigurable interleaver as in claim 9.

* * * * *